United States Patent
Haran et al.

(10) Patent No.: US 12,154,855 B2
(45) Date of Patent: Nov. 26, 2024

(54) SELF-ALIGNED PATTERNING WITH COLORED BLOCKING AND STRUCTURES RESULTING THEREFROM

(71) Applicant: Intel Corporation, Santa Clara, CA (US)

(72) Inventors: Mohit K. Haran, Hillsboro, OR (US); Reken Patel, Portland, OR (US); Richard E. Schenker, Portland, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1275 days.

(21) Appl. No.: 16/579,088

(22) Filed: Sep. 23, 2019

(65) Prior Publication Data
US 2021/0090997 A1    Mar. 25, 2021

(51) Int. Cl.
*H01L 23/528*    (2006.01)
*H01L 21/027*    (2006.01)
(Continued)

(52) U.S. Cl.
CPC ...... *H01L 23/5283* (2013.01); *H01L 21/0273* (2013.01); *H01L 21/31144* (2013.01);
(Continued)

(58) Field of Classification Search
CPC ........... H01L 23/53238; H01L 23/5283; H01L 23/5226; H01L 21/76897
See application file for complete search history.

(56) References Cited

U.S. PATENT DOCUMENTS 10,366,950 B2    7/2019    Lin
2003/0183940 A1*  10/2003   Noguchi ........... H01L 23/53295
                                                257/E21.589
(Continued)

FOREIGN PATENT DOCUMENTS

TW          201712837          4/2017

OTHER PUBLICATIONS

Office Action for Taiwan Patent Application No. 109120973 mailed Jun. 25, 2024, 13 pgs.

*Primary Examiner* — Dale E Page
*Assistant Examiner* — Wilner Jean Baptiste
(74) *Attorney, Agent, or Firm* — Schwabe, Williamson & Wyatt, P.C.

(57) ABSTRACT

Self-aligned patterning with colored blocking and resulting structures are described. In an example, an integrated circuit structure includes an inter-layer dielectric (ILD) layer above a substrate, and a hardmask layer on the ILD layer. A plurality of conductive interconnect lines is in and spaced apart by the ILD layer and the hardmask layer. The plurality of conductive interconnect lines includes a first interconnect line having a first width. A second interconnect line is immediately adjacent the first interconnect line by a first distance, the second interconnect line having the first width. A third interconnect line is immediately adjacent the second interconnect line by the first distance, the third interconnect line having the first width. A fourth interconnect line is immediately adjacent the third interconnect line by a second distance greater than the first distance, the fourth interconnect line having a second width greater than the first width.

16 Claims, 12 Drawing Sheets

(51) Int. Cl.
    *H01L 21/311*     (2006.01)
    *H01L 21/768*     (2006.01)
    *H01L 23/522*     (2006.01)
    *H01L 23/532*     (2006.01)
    *H01L 21/02*     (2006.01)

(52) U.S. Cl.
    CPC .. *H01L 21/76802* (2013.01); *H01L 21/76877* (2013.01); *H01L 21/76897* (2013.01); *H01L 23/5226* (2013.01); *H01L 23/53238* (2013.01); *H01L 21/0228* (2013.01)

(56) References Cited

U.S. PATENT DOCUMENTS

2019/0237361 A1*   8/2019   Usami ............... H01L 23/53209
2019/0372198 A1*  12/2019   Dalmia ................ H01Q 1/2283

\* cited by examiner

SELF-ALIGNED PATTERNING WITH COLORED BLOCKING AND STRUCTURES RESULTING THEREFROM

TECHNICAL FIELD

Embodiments of the disclosure are in the field of semiconductor structures and processing and, in particular, self-aligned patterning with colored blocking and structures fabricated using self-aligned patterning with colored blocking.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
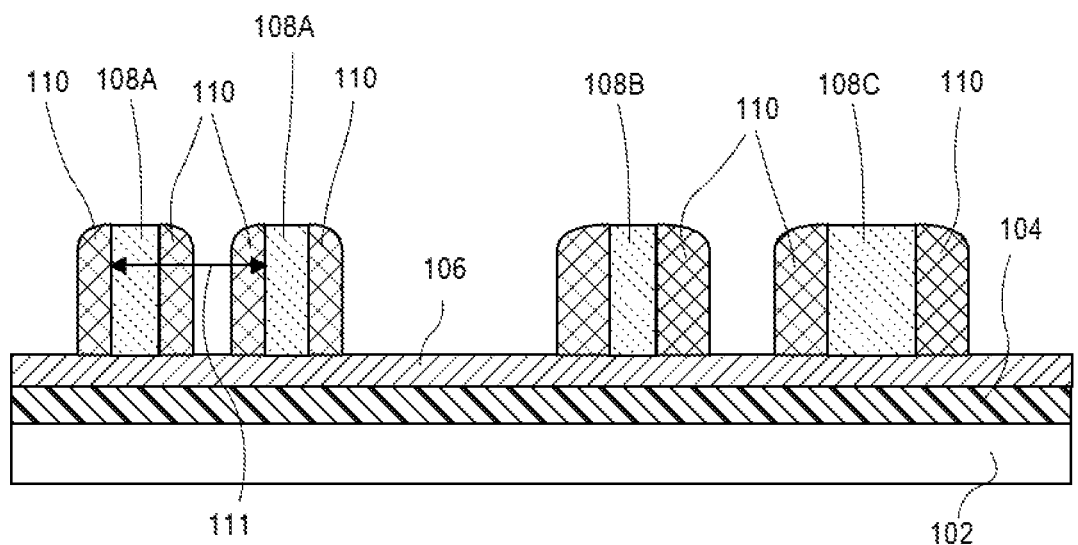
FIGS. 1A-1E illustrate cross-sectional views representing various operations in a method of self-aligned patterning with colored blocking, in accordance with an embodiment of the present disclosure.

Self-aligned patterning with colored blocking and structures fabricated using self-aligned patterning with colored blocking are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

One or more embodiments described herein are directed to advanced self-aligned patterning flows to enable tight pitch and continuously variable line and space patterns. Embodiments may be implemented to provide tight pitch metallization at pitches less than the resolution limit of the lithography process through the use of self-aligned pitch division combined with the flexibility of a direct print lithography process to allow continuously variable line/space combinations.

Previously attempted processes may have limitations in either their flexibility of design and/or minimum pitch. One or more embodiments described herein combine pitch division, plug patterning and direct print lithography to provide a flexible metal (or other) patterning solution. Implementation of embodiments described herein may allow for design flexibility for metal routing, small signal tracks, large power lines and continuously variable line/space patterns to support peripheral circuitry that needs larger line/space patterns.

In accordance with an embodiment of the present disclosure, a pattern includes elements that are patterned by pitch division techniques and other areas with variable widths and spacing of metal lines. Advantages of implementing one or more embodiments described herein may include enabling flexible line/space patterns for peripheral circuitry, enables colored or un-colored line-end plug patterning, extending the patterning to very tight pitches (e.g., less than 20 nm pitch), and/or enabling pitch division of any kind (e.g., pitch halving, quartering, 'eighthing', etc.). Embodiments described herein may be compatible with any one or more type of lithography such as 248, 193, 193i, EUV, e-beam, etc.

In a first exemplary processing scheme, operations may be described as colored flow plugs operations. FIGS. 1A-1E illustrate cross-sectional views representing various operations in a method of self-aligned patterning with colored blocking, in accordance with an embodiment of the present disclosure. FIG. 2 illustrates a cross-sectional view of a back end of line (BEOL) structure fabricated using self-aligned patterning with colored blocking, in accordance with an embodiment of the present disclosure.

Figure 2:
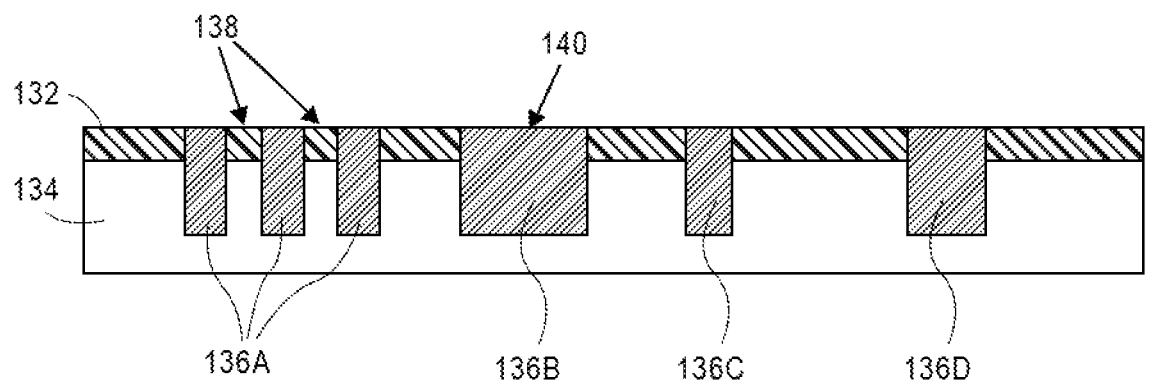
FIG. 2 illustrates a cross-sectional view of a back end of line (BEOL) structure fabricated using self-aligned patterning with colored blocking, in accordance with an embodiment of the present disclosure.

Referring to FIG. 1A, a starting structure includes a first hardmask layer 106 on a second hardmask layer 104 which is on an inter-layer dielectric (ILD) layer 102. Backbone structures 108A, 108B and 108C are on the first hardmask layer 106. In the particular embodiment shown, backbone structure 108C is wider than backbone structure 108B which may be wider than or equal to each of backbone structures 108A. The pitch 111 between backbone structures 108A represents the minimum lithography pitch of a first lithography process (either direct, or by some pitch division). Spacers 110 are along the sidewalls of each of the backbone structures 108A, 108B and 108C. It is to be appreciated that spacer 110 thickness can vary with width of the backbone (as shown), or can be formed to all have a same width. Spacers 110 may be fabricated by atomic layer deposition (ALD) of a film over the backbone structures followed by an anisotropic etch of the same film. Spacer width tailoring can be achieved based on deposition techniques sensitive to structure density and/or by using multiple spacer formation operations. In an embodiment, as would occur into or out of the page of the cross-sectional view of FIG. 1A, any one of backbone structures 108A, 108B and/or 108C can be patterned (cut) prior to spacer formation such that when spacer formation is subsequent, portions of the spacers wrap the ends of the backbone structures where the cuts are made. These locations may ultimately be used to form a line plug feature, i.e., a dielectric break in a conductive line of a metallization layer.

Figure 1B:
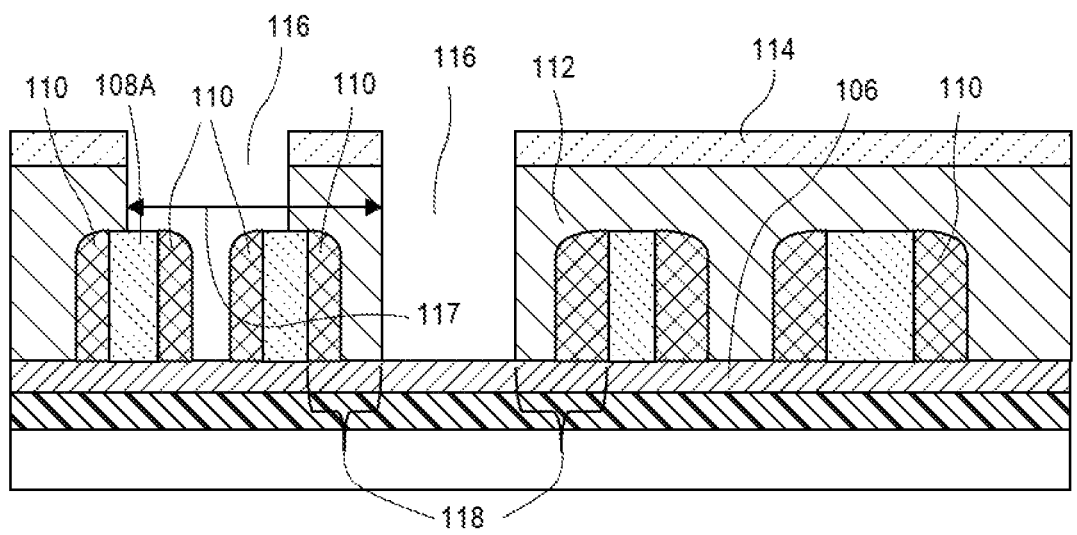

Referring to FIG. 1B, a resist layer 112 and hardmask 114 stack is formed over the structure of FIG. 1A and then patterned with a second lithographic operation to form openings 116. The minimum pitch of the second lithographic process is shown by arrow 117. Overlay dependent critical dimensions (CDs) are shown in regions 118. The operation of FIG. 1B can be referred to as forming plug masks for complement features. It is to be appreciated that openings 116 can be any size or shape and can be created from multiple exposures. The pattern of openings 116 in resist layer 112 and hardmask 114 can either be self-aligned with an existing pitch halving or pitch quartering pattern or created as a pattern that is completely defined by resist edges from the second lithography process.

Figure 1C:
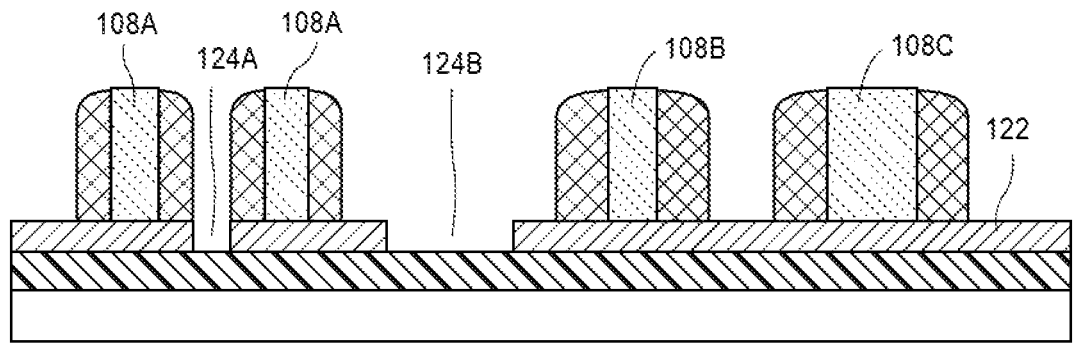

Referring to FIG. 1C, exposed portions of first hardmask layer 106 are etched to form first-time patterned first hardmask layer 122 having openings 124A and 124B therein. The resist layer 112 and hardmask 114 are then removed. The process of FIG. 1C may be referred to as an etch transfer of the second lithography process into the first hardmask layer 106.

Figure 1D:
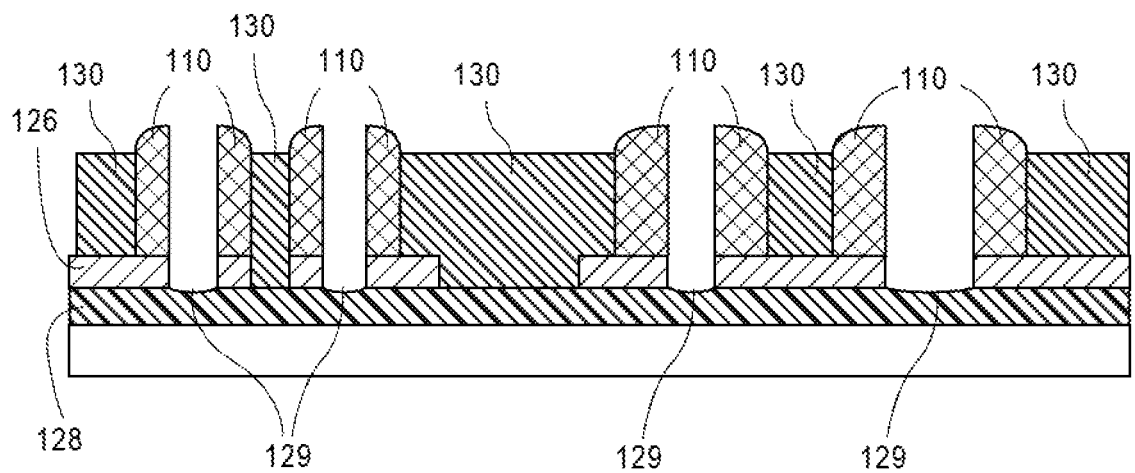

Referring to FIG. 1D, a backfill mask 130, such as a carbon-hardmask, is formed and recessed over the structure of FIG. 1C. The backbone structures 108A, 108B and 108C are then removed by a selective etch process. The first-time patterned first hardmask layer 122 is further etched in locations where the backbone structures 108A, 108B and 108C were removed to form a second-time patterned first hardmask layer 126. It is to be appreciated that the second-time patterned first hardmask layer 126 may be formed with perfect selectivity to second hardmask layer 104, or with some erosion 129 to second hardmask layer 104 to form eroded second hardmask layer 128.

Figure 1E:
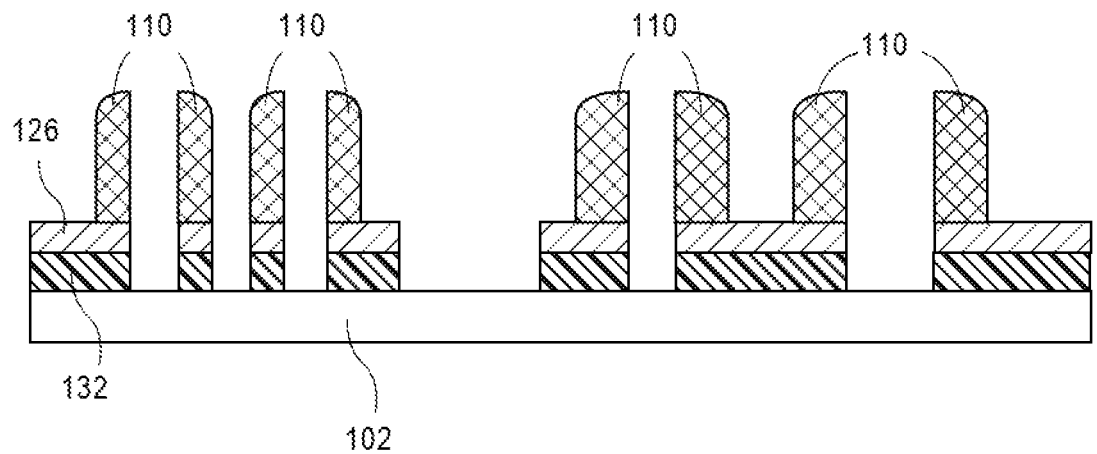

Referring to FIG. 1E, the backfill mask 130 is removed, e.g., by an ash and cleans process. Exposed portions of eroded second hardmask layer 128 are then etched to form patterned second hardmask layer 132.

Referring to FIG. 2, spacers 110 and second-time patterned first hardmask layer 126 are removed from the structure of FIG. 1E. The ILD layer 102 is patterned using patterned second hardmask layer 132 to form trenches in ILD layer 102, forming patterned ILD layer 134. The trenches are then filled with conductive material(s) to form conductive structures 136A, 136B, 136C and 136D. In an embodiment, regions 138 are spacer-defined regions, while region 140 is defined by the second lithography process described above. It is to be appreciated that the hardmasks may be consumed during the process or may be retained (e.g., patterned second hardmask layer 132 is shown as retained), e.g., for subsequent self-aligned via etch processes.

With reference again to FIG. 2, in accordance with an embodiment of the present disclosure, an integrated circuit structure includes an inter-layer dielectric (ILD) layer 134 above a substrate (not shown), and a hardmask layer 132 on the ILD layer 134. A plurality of conductive interconnect lines 136A, 136B, 136C and 136D is in and spaced apart by the ILD layer 134 and the hardmask layer 132. The plurality of conductive interconnect lines 136A, 136B, 136C and 136D includes a first interconnect line (left 136A) having a first width. A second interconnect line (middle 136A) is immediately adjacent the first interconnect line (left 136A) by a first distance, the second interconnect line (middle 136A) having the first width. A third interconnect line (right 136A) is immediately adjacent the second interconnect line (middle 136A) by the first distance, the third interconnect line (right 136A) having the first width. A fourth interconnect line 136B is immediately adjacent the third interconnect line (right 136A) by a second distance greater than the first distance, the fourth interconnect line 136B having a second width greater than the first width.

In one embodiment, the first width is defined by a first lithographic process, and the second width is defined by a second lithographic process different than the first lithographic process.

In one embodiment, the integrated circuit structure further includes a fifth interconnect line 136C immediately adjacent the fourth interconnect line 136B by a third distance greater than the first distance, the fifth interconnect line 136C having a third width less than the second width. In one such embodiment, the third width is greater than the first width. In another such embodiment, the third width is the same as the first width.

In one embodiment, the integrated circuit structure further includes a sixth interconnect line 136D immediately adjacent the fifth interconnect line 136C by a fourth distance greater than the third distance, the sixth interconnect line 136D having a fourth width. In one such embodiment, the fourth width is greater than the first width and greater than the third width, and the fourth width is less than the third width.

It is to be appreciated that additional operations may be included in the patterning flow of FIGS. 1A-1E. As an example, FIGS. 3A-3B illustrate cross-sectional views representing various additional operations in a method of self-aligned patterning with colored blocking, in accordance with an embodiment of the present disclosure.

Figure 3A:
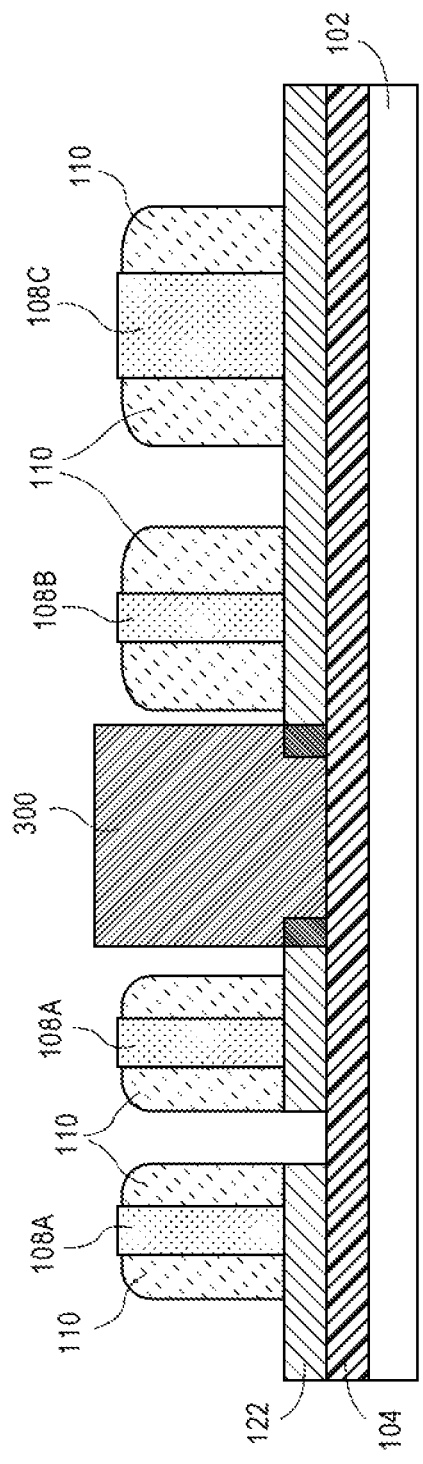
FIGS. 3A-3B illustrate cross-sectional views representing various additional operations in a method of self-aligned patterning with colored blocking, in accordance with an embodiment of the present disclosure.
Figure 3B:
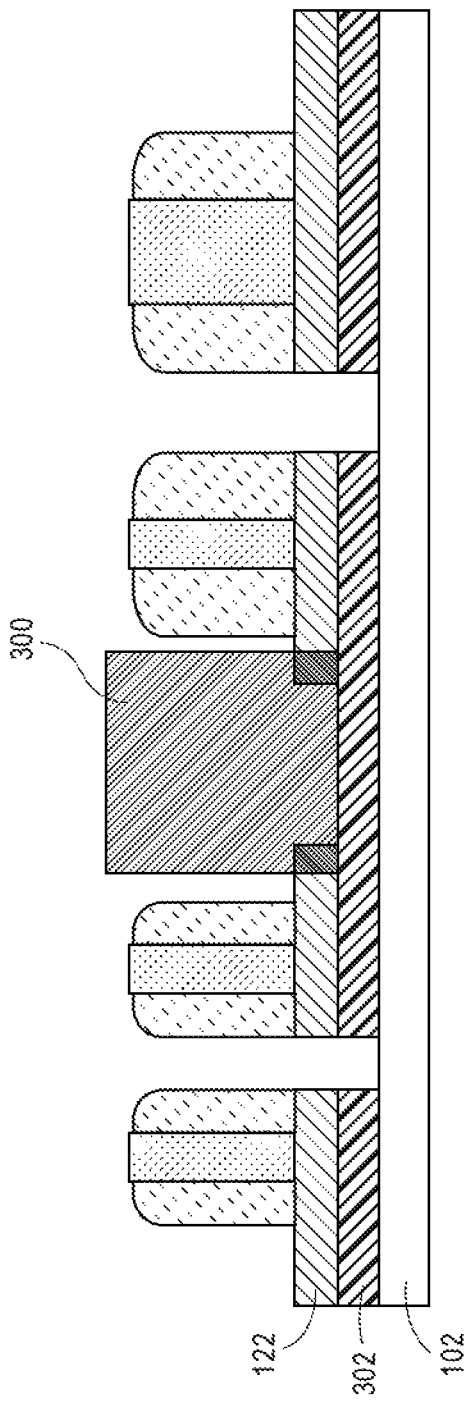

Referring to FIGS. 3A and 3B, between the process operations of FIGS. 1C and 1D, at a location into or out of the page, a blocking layer 300 may be formed. The blocking layer 300 may be retained during patterning of the second hardmask layer 104 to form patterned hardmask layer 302 having a retained portion beneath blocking layer 300, e.g., at the location into or out of the page. Such additional processing may enable further trench plug(s) patterning. For example, if small end-to-ends or any kind of blocking pattern are required, this second 'plug' pattern can be used. The pattern 300 may be referred to as a blocking lithography process that can be achieved by blocking directly with photoresist or patterning a hole and re-filling with a different blocking material before translating into the final hardmask or substrate. The pattern is then translated into hardmask material and the sacrificial plug or blocking material is subsequently removed.

In a second exemplary processing scheme, operations may be described as single plug flow. FIGS. 4A-4E illustrate cross-sectional views representing various operations in another method of self-aligned patterning with colored blocking, in accordance with an embodiment of the present disclosure.

Figure 4A:
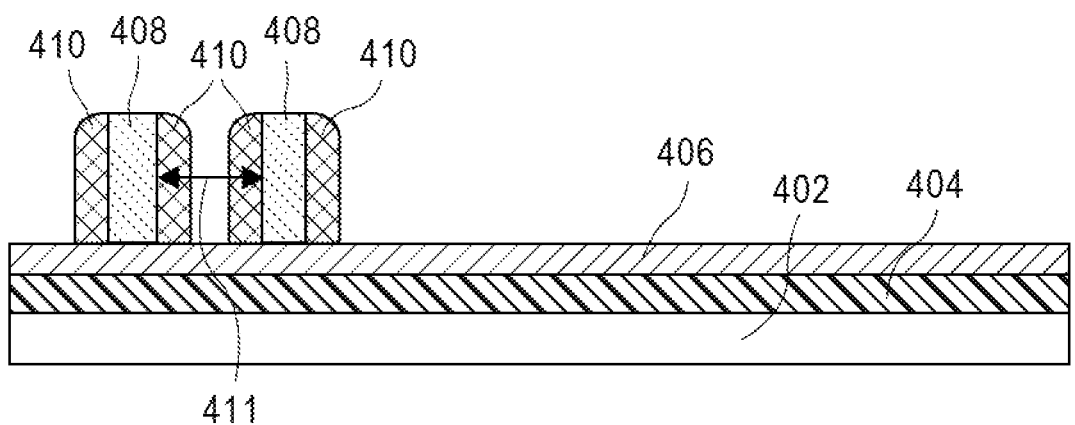
FIGS. 4A-4E illustrate cross-sectional views representing various operations in another method of self-aligned patterning with colored blocking, in accordance with an embodiment of the present disclosure.

Referring to FIG. 4A, a starting structure includes a first hardmask layer 406 on a second hardmask layer 404 which is on an inter-layer dielectric (ILD) layer 402. Backbone structures 408 are on the first hardmask layer 406. The distance 411 between backbone structures 408 represents the minimum lithography spacing of a first lithography process (either direct, or by some pitch division). Spacers 410 are along the sidewalls of each of the backbone structures 408. Spacers 410 may be fabricated by atomic layer deposition (ALD) of a film over the backbone structures followed by an anisotropic etch of the same film. In an embodiment, as would occur into or out of the page of the cross-sectional view of FIG. 4A, any one of backbone structures 408 can be patterned (cut) prior to spacer formation such that when spacer formation is subsequent, portions of the spacers wrap the ends of the backbone structures where the cuts are made. These locations may ultimately be used to form a line plug feature, i.e., a dielectric break in a conductive line of a metallization layer.

Figure 4B:
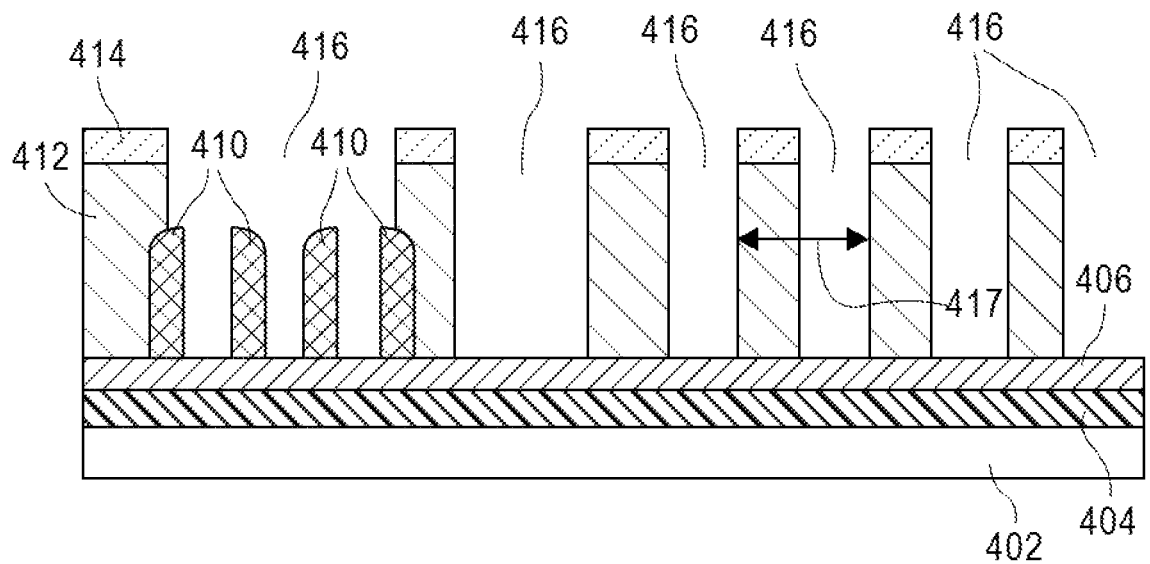

Referring to FIG. 4B, a resist layer 412 and hardmask 414 stack is formed over the structure of FIG. 4A and then patterned with a second lithographic operation to form openings 416. The backbone structures 408 are then removed. The minimum pitch of the second lithographic process is shown by arrow 417.

Figure 4C:
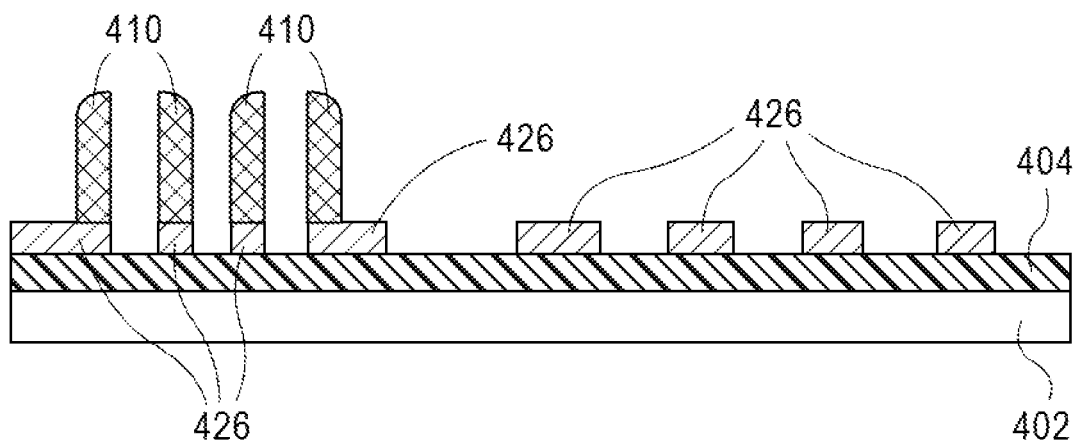

Referring to FIG. 4C, exposed portions of first hardmask layer 406 are etched to form patterned first hardmask layer 426. The resist layer 412 and hardmask 414 are then removed. The process of FIG. 4C may be referred to as an etch transfer of the first and second lithography processes into the first hardmask layer 406.

Figure 4D:
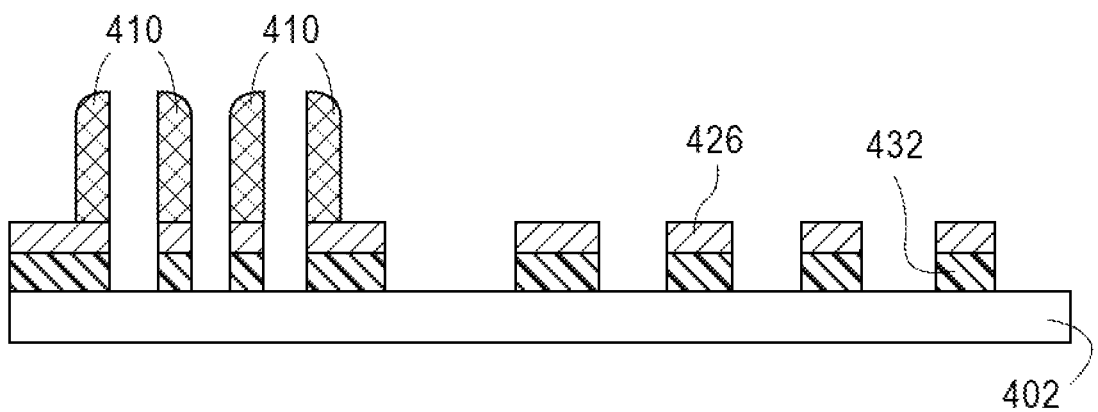

Referring to FIG. 4D, exposed portions of second hardmask layer 404 are then etched to form patterned second hardmask layer 432.

Figure 4E:
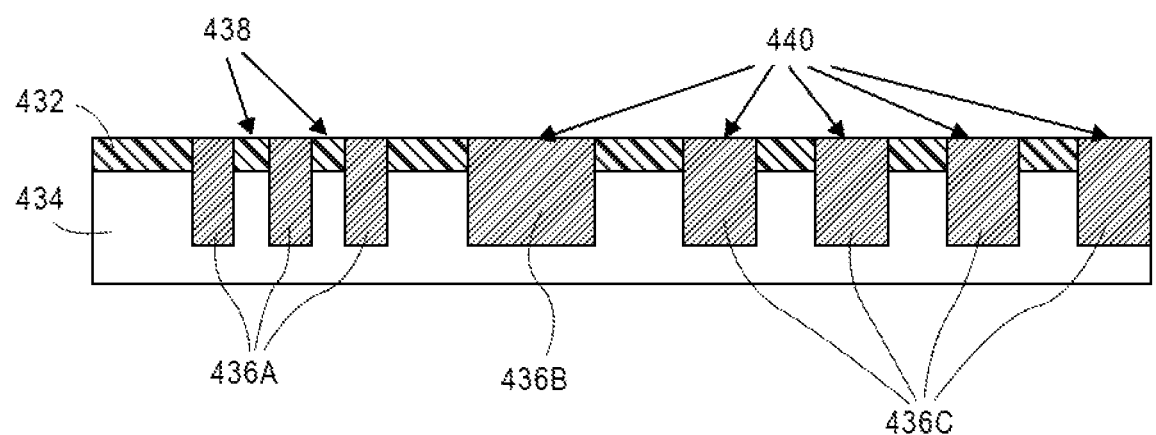

Referring to FIG. 4E, spacers 410 and patterned first hardmask layer 426 are removed from the structure of FIG. 4D. The ILD layer 402 is patterned using patterned second hardmask layer 432 to form trenches in ILD layer 402, forming patterned ILD layer 434. The trenches are then filled with conductive material(s) to form conductive structures 436A, 436B and 436C. In an embodiment, regions 438 are spacer-defined regions, while region 440 is defined by the second lithography process described above. It is to be appreciated that the hardmasks may be consumed during the process or may be retained (e.g., patterned second hardmask layer 432 is shown as retained), e.g., for subsequent self-aligned via etch processes.

With reference again to FIG. 4E, in accordance with an embodiment of the present disclosure, an integrated circuit structure includes an inter-layer dielectric (ILD) layer 434 above a substrate (not shown), and a hardmask layer 432 on the ILD layer 434. A plurality of conductive interconnect lines 436A, 436B, and 436C is in and spaced apart by the ILD layer 434 and the hardmask layer 432. The plurality of conductive interconnect lines 436A, 436B, and 436C includes a first interconnect line (left 436A) having a first width. A second interconnect line (middle 436A) is immediately adjacent the first interconnect line (left 436A) by a first distance, the second interconnect line (middle 436A) having the first width. A third interconnect line (right 436A) is immediately adjacent the second interconnect line (middle 436A) by the first distance, the third interconnect line (right 436A) having the first width. A fourth interconnect line 436B is immediately adjacent the third interconnect line (right 436A) by a second distance greater than the first distance, the fourth interconnect line 436B having a second width greater than the first width. A fifth interconnect line (left 436C) is immediately adjacent the fourth interconnect line 436B by a third distance greater than the first distance, the fifth interconnect (left 436C) line having a third width greater than the first width, the third width less than the second width. A sixth interconnect line (second from left 436C) is immediately adjacent the fifth interconnect line (left 436C) by a fourth distance less than the third distance, the sixth interconnect line having the third width. A seventh interconnect line (second from right 436C) is immediately adjacent the sixth (second from left 436C) interconnect line by the fourth distance, the seventh interconnect (second from right 436C) line having the third width. An eighth interconnect line (last on right 436C) is immediately adjacent the seventh (second from right 436C) interconnect line by the fourth distance, the eighth interconnect (last on right 436C) line having the third width.

In one embodiment, the third distance is greater than the second distance. In another embodiment, the third distance is the same as the second distance. In an embodiment, the first width is defined by a first lithographic process, and the second and third widths are defined by a second lithographic process different than the first lithographic process.

Figure 5A:
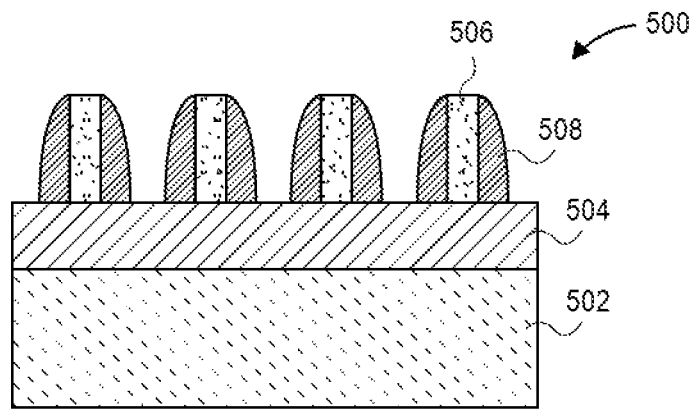
FIG. 5A illustrates a cross-sectional view of a starting structure following deposition, but prior to patterning, of a hardmask material layer formed on an interlayer dielectric (ILD) layer, in accordance with an embodiment of the present disclosure.
Figure 5B:
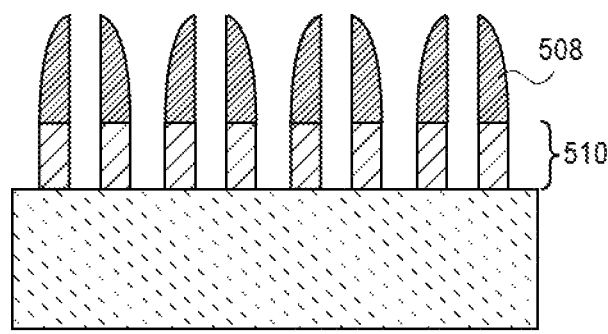
FIG. 5B illustrates a cross-sectional view of the structure of FIG. 5A following patterning of the hardmask layer by pitch halving, in accordance with an embodiment of the present disclosure.

In an embodiment, pitch division techniques are used to increase a line density. In a first example, pitch halving can be implemented to double the line density of a fabricated grating structure. FIG. 5A illustrates a cross-sectional view of a starting structure following deposition, but prior to patterning, of a hardmask material layer formed on an interlayer dielectric (ILD) layer. FIG. 5B illustrates a cross-sectional view of the structure of FIG. 5A following patterning of the hardmask layer by pitch halving.

Referring to FIG. 5A, a starting structure 500 has a hardmask material layer 504 formed on an interlayer dielectric (ILD) layer 502. A patterned mask 506 is disposed above the hardmask material layer 504. The patterned mask 506 has spacers 508 formed along sidewalls of features (lines) thereof, on the hardmask material layer 504.

Referring to FIG. 5B, the hardmask material layer 504 is patterned in a pitch halving approach. Specifically, the patterned mask 506 is first removed. The resulting pattern of the spacers 508 has double the density, or half the pitch or the features of the mask 506. The pattern of the spacers 508 is transferred, e.g., by an etch process, to the hardmask material layer 504 to form a patterned hardmask 510, as is depicted in FIG. 5B. In one such embodiment, the patterned hardmask 510 is formed with a grating pattern having unidirectional lines. The grating pattern of the patterned hardmask 510 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 510 of FIG.

5B may have hardmask lines spaced at a constant pitch and having a constant width relative to one another. The dimensions achieved may be far smaller than the critical dimension of the lithographic technique employed. Accordingly, a blanket film may be patterned using lithography and etch processing which may involve, e.g., spacer-based-double-patterning (SBDP) or pitch halving, or spacer-based-quadruple-patterning (SBQP) or pitch quartering.

Figure 6:
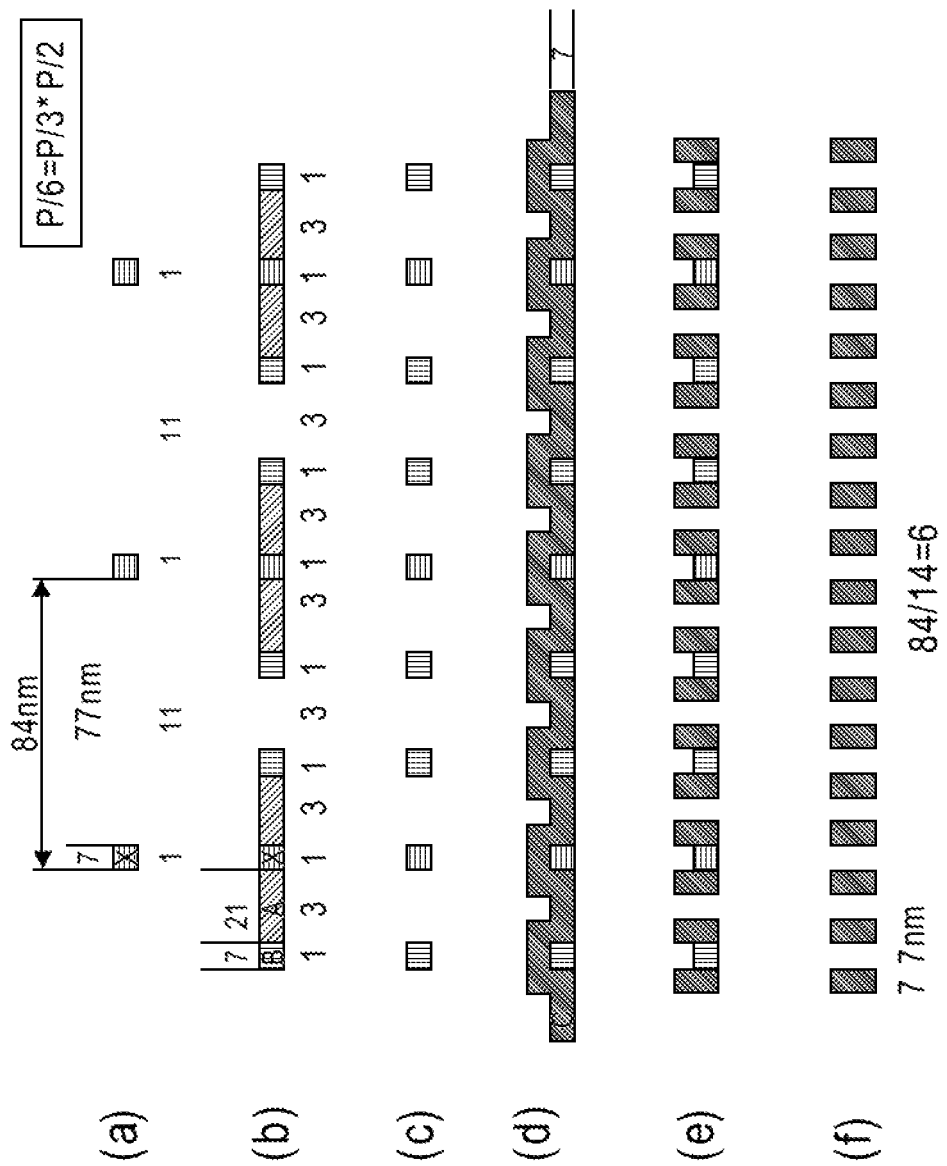
FIG. 6 illustrates cross-sectional views in a spacer-based-sextuple-patterning (SBSP) processing scheme which involves pitch division by a factor of six, in accordance with an embodiment of the present disclosure.

It is to be appreciated that other pitch division approaches may also be implemented. For example, FIG. 6 illustrates cross-sectional views in a spacer-based-sextuple-patterning (SBSP) processing scheme which involves pitch division by a factor of six. Referring to FIG. 6, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

It is to be appreciated that the layers and materials described above in association with back end of line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the art, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. The CHM layer is more commonly known as a SOC (spin-on carbon) layer in the industry. CHM is an Intel term. Secondly, the Si-ARC and the SOC are anti-reflective layers. They work together to provide low reflectivty. The SOC layer also can help planarize the substrate prior to lithography and/or to fill trenches/VIAs if patterning over topography.

It is to be appreciated that embodiments described above may be implemented to pattern trenches for filling with structures. In another aspect, patterning approaches described herein can also be used to pattern spaces between structures, e.g., to pattern a sacrificial gate layer to form gates of differing spacing and width (i.e., gate length) in a same patterning scheme. In an embodiment, one or more embodiments described herein are directed to fabricating semiconductor devices, such as for PMOS and NMOS device fabrication. For example, approaches described herein may be implemented to fabricate a gate line.

Figure 7A:
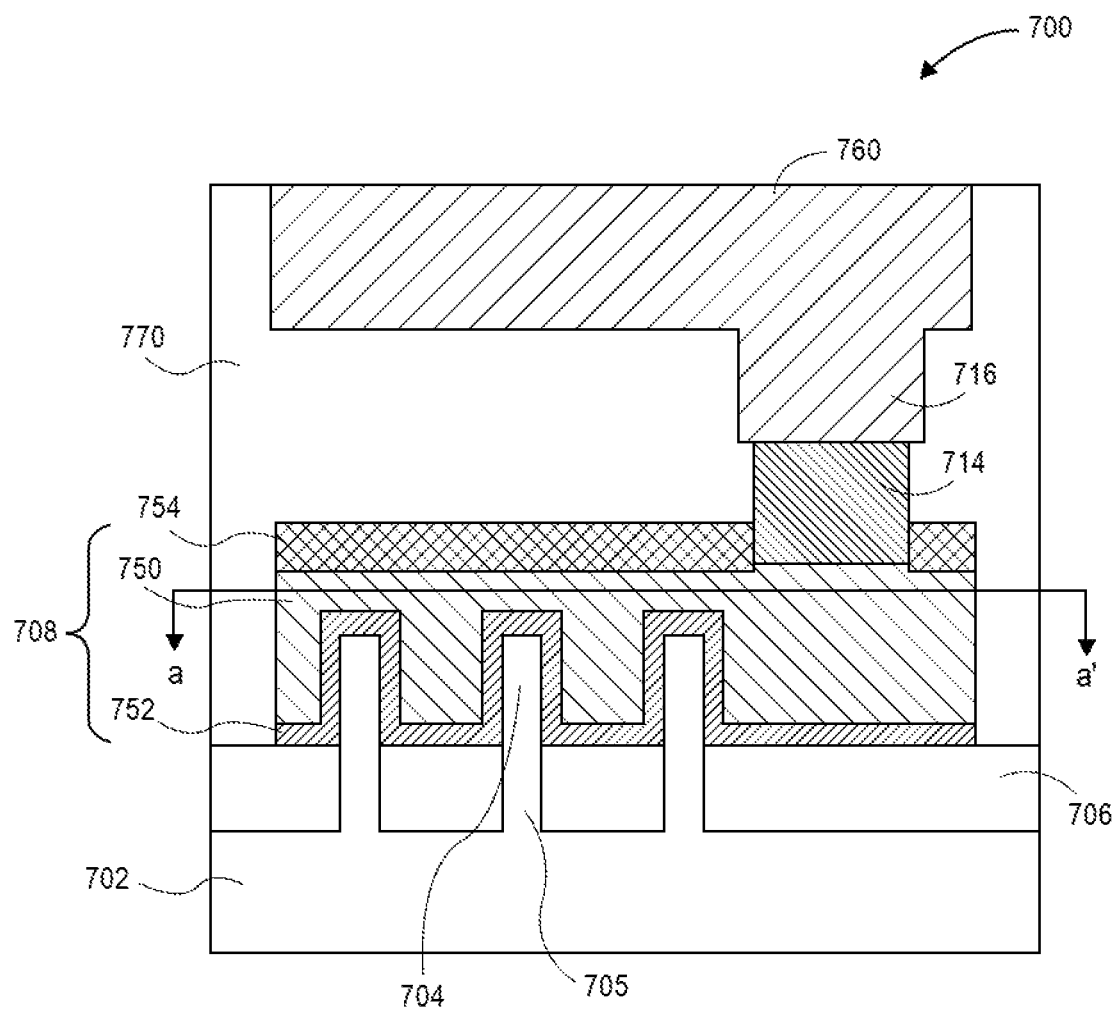
FIG. 7A illustrates a cross-sectional view of a non-planar semiconductor device fabricated using a self-aligned patterning with colored blocking scheme, in accordance with an embodiment of the present disclosure.
Figure 7B:
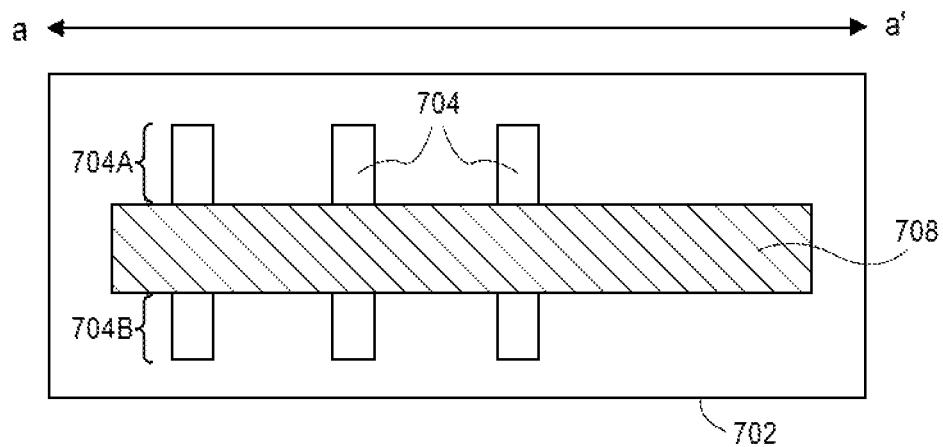
FIG. 7B illustrates a plan view taken along the a-a' axis of the semiconductor device of FIG. 7A, in accordance with an embodiment of the present disclosure.

As an example of a completed device as taken through a single gate line, FIG. 7A illustrates a cross-sectional view of a non-planar semiconductor device fabricated using a self-aligned patterning with colored blocking scheme, in accordance with an embodiment of the present disclosure. FIG. 7B illustrates a plan view taken along the a-a' axis of the semiconductor device of FIG. 7A, in accordance with an embodiment of the present disclosure. Although only one gate line is shown, it is to be appreciated that a variety of gate lines may be included in an integrated circuit structure, where adjacent gate lines have varying spacing and width, where the spacing between gate line is patterned using a process described in association with FIGS. 1A-1E, FIGS. 3A-3B, and/or FIGS. 4A-4D.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750 and a gate dielectric layer 752. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. The gate contact 714 is formed in an opening formed in the dielectric cap layer 754. Also seen from the perspective of FIG. 7A, the gate contact 714 is, in one embodiment, disposed over isolation region 706, but not over the non-planar active regions. In other embodiments, the gate contact 714 is disposed over the non-planar active regions.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, boron or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon mono-crystalline substrate. Bulk substrate 702 may alternatively be composed of a group III-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

Gate line 708 may be composed of a gate electrode stack which includes a gate dielectric layer 752 and a gate electrode layer 750. In an embodiment, the gate electrode layer 750 of the gate electrode stack is composed of a metal gate and the gate dielectric layer 752 is composed of a high-k material. For example, in one embodiment, the gate dielectric layer 752 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 752 may include a layer of native oxide formed from the top few layers of the substrate 702. In an embodiment, the gate dielectric layer 752 is composed of a top high-k portion and a lower portion composed of an oxide of a semiconductor material. In one embodiment, the gate dielectric layer 752 is composed of a top portion of hafnium oxide and a bottom portion of silicon dioxide or silicon oxy-nitride.

In an embodiment, the gate electrode layer 750 of gate line 708 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode 750 is composed of a non-workfunction-setting fill material formed above a metal workfunction-setting layer. The gate electrode layer 750 may consist of a P-type workfunction metal or an N-type workfunction metal, depending on whether the transistor is to be a PMOS or an NMOS transistor. In some implementations, the gate electrode layer 750 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode layer 750 may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 714 and overlying gate contact via 716 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). In accordance with another embodiment of the present disclosure, the gate contact 714 is a self-aligned gate contact.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the art. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
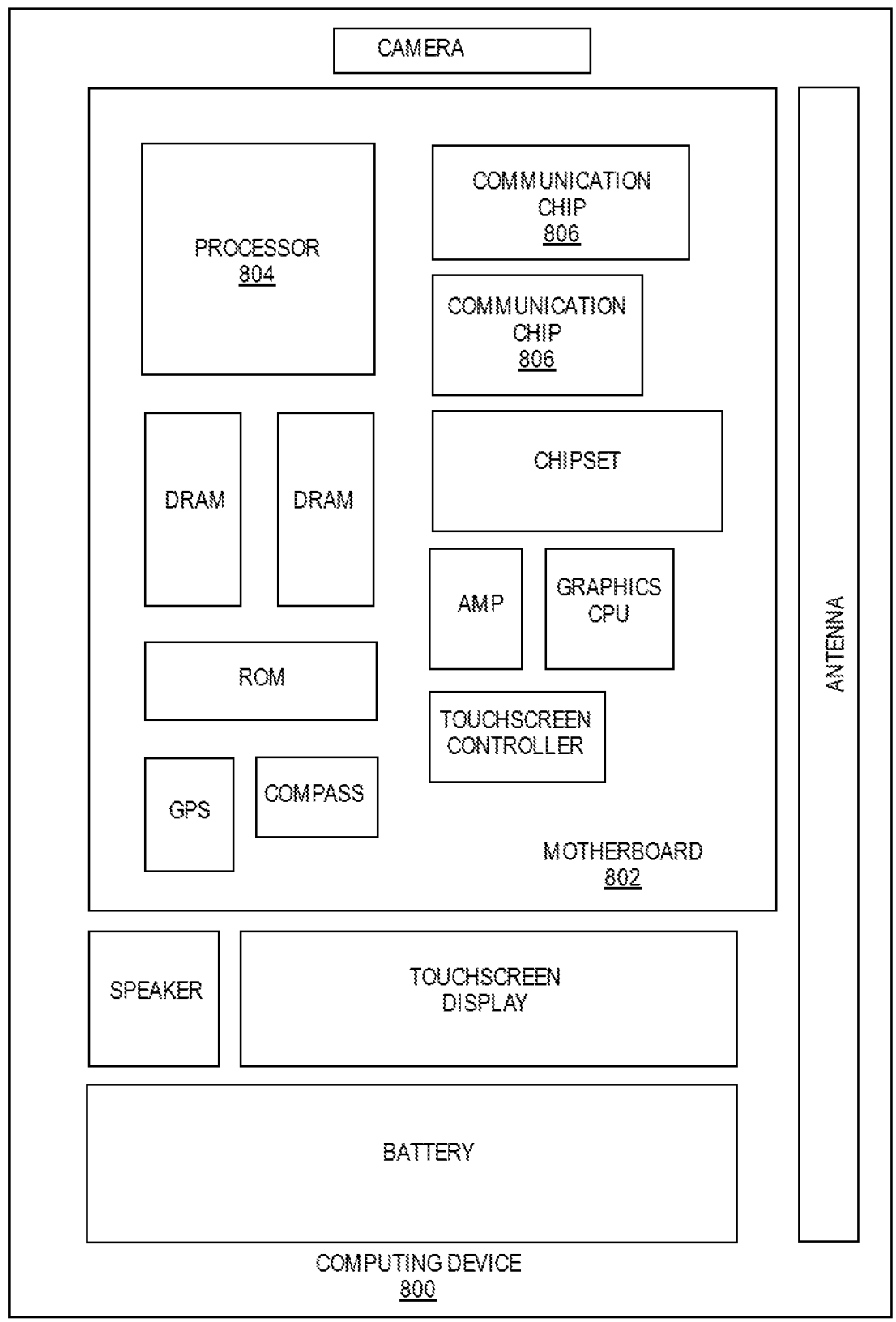
FIG. 8 illustrates a computing device in accordance with one implementation of an embodiment of the present disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor 804 includes one or more structures, such as structures fabricated using self-aligned patterning with colored blocking, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the disclosure, the integrated circuit die of the communication chip 806 includes one or more structures, such as structures fabricated using self-aligned patterning with colored blocking, in accordance with implementations of embodiments of the disclosure.

In further implementations, another component housed within the computing device 800 may contain an integrated circuit die that includes one or more structures, such as structures fabricated using self-aligned patterning with colored blocking, in accordance with implementations of embodiments of the disclosure.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
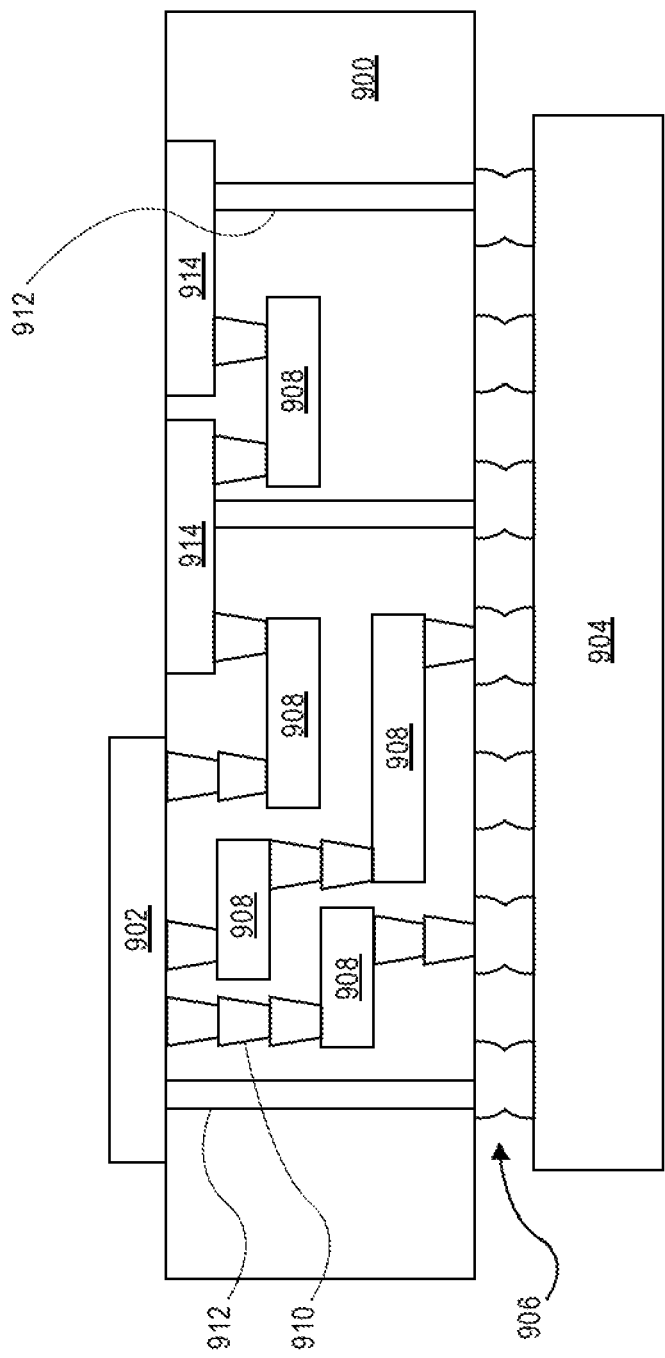
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer 900 may be formed of alternate rigid or flexible materials that may include the same materials described above for use in a semiconductor substrate, such as silicon, germanium, and other group III-V and group IV materials.

The interposer 900 may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900 and/or in the fabrication of substrates connected thereto.

Thus, embodiments of the present disclosure include self-aligned patterning with colored blocking and structures fabricated using self-aligned patterning with colored blocking.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes an inter-layer dielectric (ILD) layer above a substrate, and a hardmask layer on the ILD layer. A plurality of conductive interconnect lines is in and spaced apart by the ILD layer and the hardmask layer. The plurality of conductive interconnect lines includes a first interconnect line having a first width. A second interconnect line is immediately adjacent the first interconnect line by a first distance, the second interconnect line having the first width. A third interconnect line is immediately adjacent the second interconnect line by the first distance, the third interconnect line having the first width. A fourth interconnect line is immediately adjacent the third interconnect line by a second distance greater than the first distance, the fourth interconnect line having a second width greater than the first width.

Example embodiment 2: The integrated circuit structure of example embodiment 1, wherein the first width is defined by a first lithographic process, and the second width is defined by a second lithographic process different than the first lithographic process.

Example embodiment 3: The integrated circuit structure of example embodiment 1 or 2, further including a fifth interconnect line immediately adjacent the fourth interconnect line by a third distance greater than the first distance, the fifth interconnect line having a third width less than the second width.

Example embodiment 4: The integrated circuit structure of example embodiment 3, wherein the third width is greater than the first width.

Example embodiment 5: The integrated circuit structure of example embodiment 3, wherein the third width is the same as the first width.

Example embodiment 6: The integrated circuit structure of example embodiment 3, 4 or 5, further including a sixth interconnect line immediately adjacent the fifth interconnect line by a fourth distance greater than the third distance, the sixth interconnect line having a fourth width.

Example embodiment 7: The integrated circuit structure of example embodiment 6, wherein the fourth width is greater than the first width and greater than the third width, and wherein the fourth width is less than the third width.

Example embodiment 8: An integrated circuit structure includes an inter-layer dielectric (ILD) layer above a substrate, and a hardmask layer on the ILD layer. A plurality of conductive interconnect lines is in and spaced apart by the ILD layer and the hardmask layer. The plurality of conductive interconnect lines includes a first interconnect line having a first width. A second interconnect line is immediately adjacent the first interconnect line by a first distance, the second interconnect line having the first width. A third interconnect line is immediately adjacent the second interconnect line by the first distance, the third interconnect line having the first width. A fourth interconnect line is immediately adjacent the third interconnect line by a second distance greater than the first distance, the fourth interconnect line having a second width greater than the first width. A fifth interconnect line is immediately adjacent the fourth interconnect line by a third distance greater than the first distance, the fifth interconnect line having a third width greater than the first width, the third width less than the second width. A sixth interconnect line is immediately adjacent the fifth interconnect line by a fourth distance less than the third distance, the sixth interconnect line having the third width. A seventh interconnect line is immediately adjacent the sixth interconnect line by the fourth distance, the seventh interconnect line having the third width.

Example embodiment 9: The integrated circuit structure of example embodiment 8, wherein the first width is defined by a first lithographic process, and the second and third widths are defined by a second lithographic process different than the first lithographic process.

Example embodiment 10: The integrated circuit structure of example embodiment 8 or 9, wherein the third distance is greater than the second distance.

Example embodiment 11: The integrated circuit structure of example embodiment 8 or 9, wherein the third distance is the same as the second distance.

Example embodiment 12: A computing device includes a board and a component coupled to the board. The component includes an integrated circuit structure. The integrated circuit structure includes an inter-layer dielectric (ILD) layer above a substrate, and a hardmask layer on the ILD layer. A plurality of conductive interconnect lines is in and spaced apart by the ILD layer and the hardmask layer. The plurality of conductive interconnect lines includes a first interconnect line having a first width. A second interconnect line is immediately adjacent the first interconnect line by a first distance, the second interconnect line having the first width. A third interconnect line is immediately adjacent the second interconnect line by the first distance, the third interconnect line having the first width. A fourth interconnect line is immediately adjacent the third interconnect line by a second distance greater than the first distance, the fourth interconnect line having a second width greater than the first width.

Example embodiment 13: The computing device of example embodiment 12, further including a memory coupled to the board.

Example embodiment 14: The computing device of example embodiment 12 or 13, further including a communication chip coupled to the board.

Example embodiment 15: The computing device of example embodiment 12, 13 or 14, further including a camera coupled to the board.

Example embodiment 16: The computing device of example embodiment 12, 13, 14 or 15, further including a battery coupled to the board.

Example embodiment 17: The computing device of example embodiment 12, 13, 14, 15 or 16, further including an antenna coupled to the board.

Example embodiment 18: The computing device of example embodiment 12, 13, 14, 15, 16 or 17, wherein the component is a packaged integrated circuit die.

Example embodiment 19: The computing device of example embodiment 12, 13, 14, 15, 16, 17 or 18, wherein the component is selected from the group consisting of a processor, a communications chip, and a digital signal processor.

Example embodiment 20: The computing device of example embodiment 12, 13, 14, 15, 16, 17, 18 or 19, wherein the computing device is selected from the group consisting of a mobile phone, a laptop, a desk top computer, a server, and a set-top box.

What is claimed is:

1. An integrated circuit structure, comprising:
an inter-layer dielectric (ILD) layer above a substrate;
a hardmask layer on the ILD layer, the hardmask layer having an uppermost surface;
a plurality of conductive interconnect lines in and spaced apart by the ILD layer and the hardmask layer, the plurality of conductive interconnect lines comprising:
a first interconnect line having a first width, the first interconnect line having an uppermost surface at a same level as the uppermost surface of the hardmask layer;
a second interconnect line immediately adjacent the first interconnect line by a first distance, the second interconnect line having the first width, and the second interconnect line having an uppermost surface at a same level as the uppermost surface of the hardmask layer;
a third interconnect line immediately adjacent the second interconnect line by the first distance, the third interconnect line having the first width, and the third interconnect line having an uppermost surface at a same level as the uppermost surface of the hardmask layer; and
a fourth interconnect line immediately adjacent the third interconnect line by a second distance greater than the first distance, the fourth interconnect line having a second width greater than the first width, and the fourth interconnect line having an uppermost surface at a same level as the uppermost surface of the hardmask layer.

2. The integrated circuit structure of claim 1, wherein the first width is defined by a first lithographic process, and the second width is defined by a second lithographic process different than the first lithographic process.

3. The integrated circuit structure of claim 1, further comprising:
a fifth interconnect line immediately adjacent the fourth interconnect line by a third distance greater than the first distance, the fifth interconnect line having a third width less than the second width.

4. The integrated circuit structure of claim 3, wherein the third width is greater than the first width.

5. The integrated circuit structure of claim 3, wherein the third width is the same as the first width.

6. The integrated circuit structure of claim 3, further comprising:
a sixth interconnect line immediately adjacent the fifth interconnect line by a fourth distance greater than the third distance, the sixth interconnect line having a fourth width.

7. The integrated circuit structure of claim 6, wherein the fourth width is greater than the first width and greater than the third width, and wherein the fourth width is less than the third width.

8. A computing device, comprising:
a board; and
a component coupled to the board, the component including an integrated circuit structure, comprising:
an inter-layer dielectric (ILD) layer above a substrate;
a hardmask layer on the ILD layer, the hardmask layer having an uppermost surface;
a plurality of conductive interconnect lines in and spaced apart by the ILD layer and the hardmask layer, the plurality of conductive interconnect lines comprising:
a first interconnect line having a first width, the first interconnect line having an uppermost surface at a same level as the uppermost surface of the hardmask layer;
a second interconnect line immediately adjacent the first interconnect line by a first distance, the second interconnect line having the first width, and the second interconnect line having an uppermost surface at a same level as the uppermost surface of the hardmask layer;
a third interconnect line immediately adjacent the second interconnect line by the first distance, the third interconnect line having the first width, and the third interconnect line having an uppermost surface at a same level as the uppermost surface of the hardmask layer;
a fourth interconnect line immediately adjacent the third interconnect line by a second distance greater than the first distance, the fourth interconnect line having a second width greater than the first width, and the fourth interconnect line having an uppermost surface at a same level as the uppermost surface of the hardmask layer.

9. The computing device of claim 8, further comprising: a memory coupled to the board.

10. The computing device of claim 8, further comprising: a communication chip coupled to the board.

11. The computing device of claim 8, further comprising: a camera coupled to the board.

12. The computing device of claim 8, further comprising: a battery coupled to the board.

13. The computing device of claim 8, further comprising: an antenna coupled to the board.

14. The computing device of claim 8, wherein the component is a packaged integrated circuit die.

15. The computing device of claim 8, wherein the component is selected from the group consisting of a processor, a communications chip, and a digital signal processor.

16. The computing device of claim 8, wherein the computing device is selected from the group consisting of a mobile phone, a laptop, a desk top computer, a server, and a set-top box.

* * * * *